United States Patent
Schürz et al.

(10) Patent No.: US 7,605,520 B2
(45) Date of Patent: Oct. 20, 2009

(54) CONNECTING PIEZOACTUATOR

(75) Inventors: Willibald Schürz, Pielenhofen (DE); Martin Simmet, Bad Abbach (DE)

(73) Assignee: Siemens Aktiengesellschaft, Munich (DE)

( * ) Notice: Subject to any disclaimer, the term of this patent is extended or adjusted under 35 U.S.C. 154(b) by 124 days.

(21) Appl. No.: 10/595,153

(22) PCT Filed: Jun. 3, 2004

(86) PCT No.: PCT/EP2004/051015

§ 371 (c)(1), (2), (4) Date: Mar. 7, 2006

(87) PCT Pub. No.: WO2005/027235

PCT Pub. Date: Mar. 24, 2005

(65) Prior Publication Data

US 2007/0040480 A1    Feb. 22, 2007

(30) Foreign Application Priority Data

Sep. 8, 2003  (DE)  ............... 103 41 333

(51) Int. Cl.
*H01L 41/047* (2006.01)
*H02N 2/04* (2006.01)
(52) U.S. Cl. .................. 310/328; 310/366
(58) Field of Classification Search ........ 310/340, 310/344, 348, 365, 366, 328
See application file for complete search history.

(56) References Cited

U.S. PATENT DOCUMENTS

| | | | |
|---|---|---|---|
| 6,208,026 B1 | 3/2001 | Bindig et al. | 257/718 |
| 6,316,863 B1 * | 11/2001 | Schuh et al. | 310/328 |
| 6,794,800 B1 * | 9/2004 | Heinz | 310/366 |
| 7,259,504 B2 * | 8/2007 | Schurz et al. | 310/365 |

FOREIGN PATENT DOCUMENTS

| | | |
|---|---|---|
| EP | 0 844 678 A1 | 5/1998 |
| WO | 00/63980 | 10/2000 |

OTHER PUBLICATIONS

International Search Report and Written Opinion in German & English Translation; PCT/EP2004/051015; 18 Pgs.

* cited by examiner

*Primary Examiner*—Walter Benson
*Assistant Examiner*—Derek J Rosenau
(74) *Attorney, Agent, or Firm*—King & Spalding L.L.P.

(57) ABSTRACT

A circuit arrangement for operating a linear exhaust-gas probe has a measuring cell for measuring a gas concentration by determining a measuring-cell voltage, in addition to a pump cell for pumping gas. A comparator circuit compares the measuring-cell voltage with a target voltage and provides a corresponding analog deviation signal. A pump current source provides the pump current is controlled by the deviation signal using a control circuit for the approximation of the measuring cell voltage to the target voltage. In order to reliably limit the pump voltage with no significant detrimental effect on the operation, the circuit also comprises: a second comparator circuit for comparing the pump voltage with a predefined threshold voltage and for providing a corresponding binary switching signal; and a counter coupling path between the output of the pump current source and the control circuit, the path being enabled when the threshold voltage is exceeded.

6 Claims, 2 Drawing Sheets

CONNECTING PIEZOACTUATOR

CROSS-REFERENCE TO RELATED APPLICATIONS

This application is a U.S. national stage application of International Application No. PCT/EP2004/051015 filed Jun. 3, 2004, which designates the United States of America, and claims priority to German application number DE 103 41 333.2 filed Sep. 8, 2003, the contents of which are hereby incorporated by reference in their entirety.

TECHNICAL FIELD

The invention relates to a piezoactuator comprising a piezoceramic which can expand when a voltage is applied and a contacting element which rests against the piezoceramic, as well as to a method for the production thereof.

BACKGROUND

When such piezoelectric components, which are produced in particular from piezoceramics, are used, use is made of the effect whereby these components generate a voltage when a mechanical pressure or tension is applied, or conversely an extension of the actuator can be achieved by applying an electric voltage to the piezoactuator. In order to increase the usable extension length, monolithic multilayer actuators are used which consist of a sintered stack of thin films of piezoceramic with embedded internal electrodes. The internal electrodes are alternately brought out of the stack and electrically connected in parallel via external electrodes. A strip- or band-shaped end-to-end external metallization is preferably attached to both contact sides of the stack. The external metallization is connected to all the internal electrodes of equal polarity. A further contacting element, which can be fashioned in a plurality of forms, is frequently also provided between the external metallization and the electrical terminals. If a voltage is now applied to the external metallization, then the piezofilm extends in the direction of the applied field. As a result of the mechanical series connection of the individual piezofilms, the so-called nominal extension of the entire stack is reached even at relatively low voltages.

From EP 0 844 678 A1 a contacting method is known, with the aid of which a piezoceramic can be contacted such that destruction of the piezoactuator does not occur, even at high dynamic loadings. To this end, a three-dimensionally structured electrically conductive electrode is arranged between the ground metallization of the piezoceramic and the connecting elements. This electrode is connected via partial contact points to the ground metallization of the piezoceramic. It is fashioned extensibly between the contact points. This arrangement provides that the operating current of the actuator is subdivided into secondary currents, these flowing from the contact points via the ground metallization to the metal island electrodes. It can by this means be provided that even a dynamic loading of the piezoactuator does not lead to its destruction. However, the contacting is technically complex and expensive to execute.

SUMMARY

The object of the present invention is therefore to propose a piezoactuator which can simply and cost-effectively be contacted electrically and a method for its production. This object can be achieved a piezoactuator comprising a piezoceramic which can expand when a voltage is applied and contacting elements which rest against the piezoceramic, wherein the contacting elements are formed as profiled sheets which have contact surfaces spaced at intervals from one another.

The object can also be achieved by a method for producing a piezoactuator comprising a piezoceramic and a contacting element, the method comprising the steps of forming the contacting elements as contact surfaces on a bent profiled sheet, wherein the contact surfaces are spaced at intervals from one another, fixing the bent profiled sheet to an external surface (of a plastic cage, and introducing the piezoceramic into a cavity of the plastic cage such that the contact surfaces rest against a metallization of the piezoceramic.

The piezoactuator comprises correspondingly a piezoceramic which extends when a voltage is applied. Contacting elements are provided in order to apply the voltage to the piezoceramic. These contacting elements are fashioned as bent profiled sheets, the profiled sheets having contact surfaces, spaced at intervals from one another, which form the contact.

In a preferred embodiment, the profiled sheet is bent. In an especially preferred embodiment, the bending of the profiled sheets is designed such that the contact surfaces rest against the piezoceramic with a defined force.

A metallization which is connected to the contact surfaces is provided on the piezoceramic. The contact surfaces on the profiled sheet can be fashioned such that they form two contact tracks, spaced at an interval from one another, running in the longitudinal direction of the profiled sheet. In this way, the contact tracks extend in the longitudinal direction of the piezoceramic.

Furthermore, the profiled sheets can be fixed to the external surface of a plastic cage. The piezoceramic is positioned in this embodiment in the interior of the plastic cage such that the contact surfaces of the profiled sheets are in contact with a metallization of the piezoceramic.

In order to produce the piezoactuator, the contact surfaces are fashioned on a bent profiled sheet. The contact surfaces are spaced at intervals from one another. The profiled sheet is fixed to the external surface of a plastic cage. The piezoceramic is introduced into the interior of the plastic cage such that the contact surfaces rest against a metallization of the piezoceramic.

The profiled sheets are preferably bent such that, after the piezoceramic has been introduced into the plastic cage, the contact surfaces apply a defined force.

The profiled sheets can be etched in order to produce a better contact. The fixing of the profiled sheets to the outside of the plastic cage can be effected in particular by means of caulking.

The profiled sheets are bent such that the contact surfaces press with a predetermined force against the metallization running laterally on the piezoceramic. The contact surfaces are preferably fixed in relation to the contact surfaces of the metallization so that advantageously, when the piezoceramic deflects axially, no frictional relative movement which could lead to a temporary interruption of the contact occurs between contact surfaces (30,32) and metallization.

This modular construction of the contacting element and its fashioning as a sliding contact mean that the piezoceramic can be contacted without any soldering of the individual contact points being required. The modular structure and the introduction of components into one another make it possible for the piezoactuator to be produced simply and cost-effectively, since complicated work steps can be dispensed with and simple materials can be resorted to.

BRIEF DESCRIPTION OF THE DRAWINGS

Further advantages and advantageous embodiments of the invention are the subject matter of the figures below and of the descriptions thereof. In detail.

DETAILED DESCRIPTION

Figure 1:
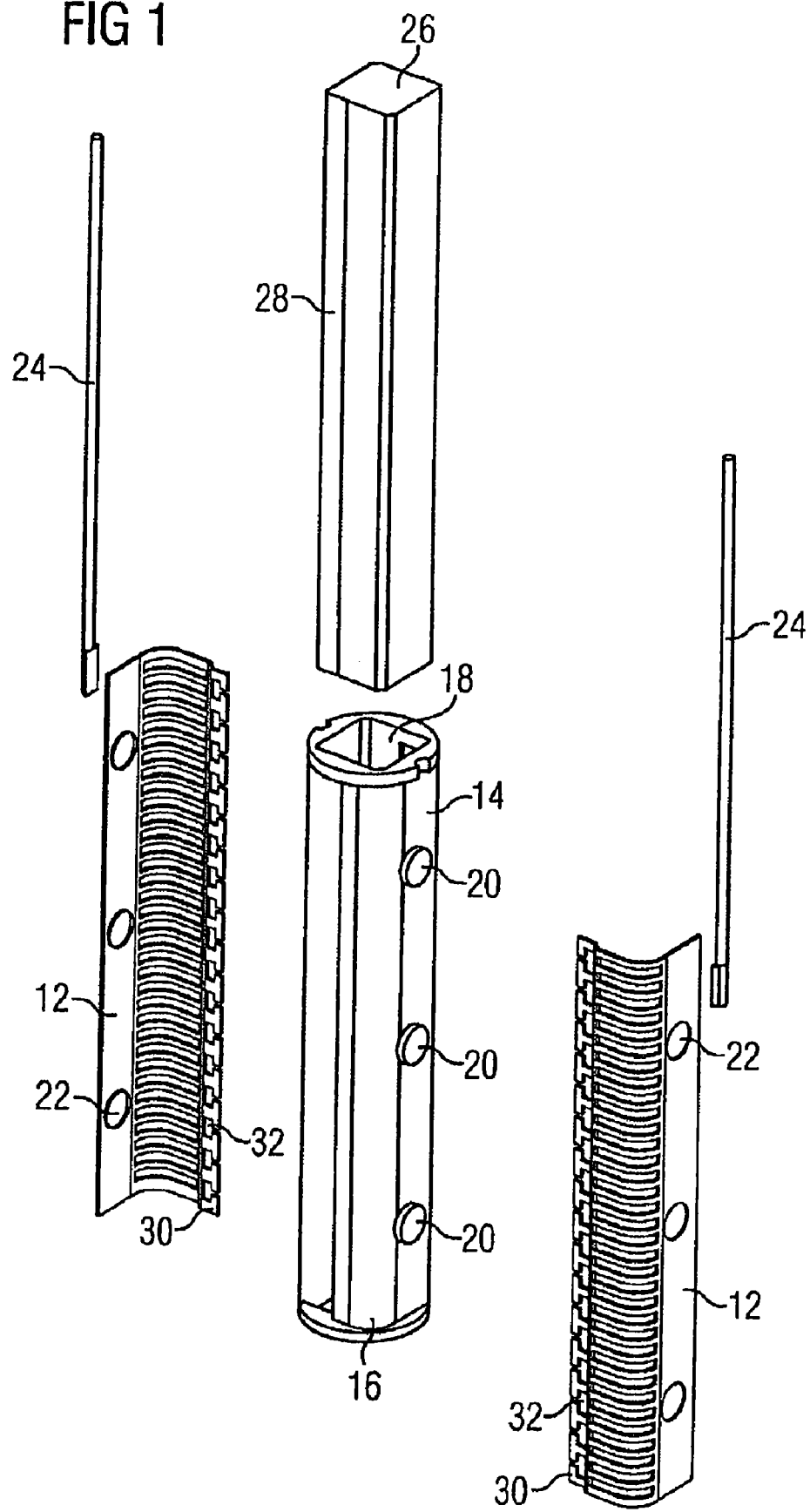
FIG. 1 shows a schematic view of the individual components of the piezoactuator
Figure 2:
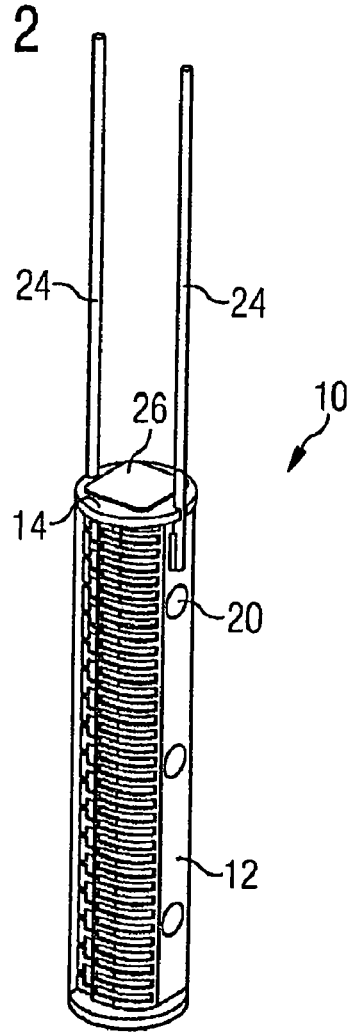
FIG. 2 shows a ready-assembled piezoactuator

FIG. 1 shows in a schematic representation the individual components of the piezoactuator 10 (FIG. 2). Here, there are firstly provided two profiled sheets 12. The two profiled sheets 12 are bent and preferably etched. A plastic cage 14 which has an external surface 16 and a cavity 18 is also provided. The bending of the profiled sheets 12 is executed in such a way that the sheets 12 can be affixed to the external surface 16, the plastic cage 14 being enveloped. In order to attach the profiled sheets 12, fixing points 20 are preferably provided on the surface 16 of the plastic cage 14, with the aid of which the profiled sheets can be fixed. To this end, counterparts to the fixing points 20, for example in the form of cavities or holes 22, are provided on the profiled sheets 12. In this way, the profiled sheets can, for example, be caulked to the fixing points 20. Furthermore, contact wires 24 can be attached, in particular soldered or welded, to the profiled sheets 12.

A piezoceramic 26 can be introduced into the cavity 18 of the plastic cage 14. The external shape of the piezoceramic 26 is adapted to fit the shape of the cavity 18. In order to be able to contact the piezoceramic 26, it has at least one sub-area 28 which is metallized.

Since the bending of the profiled sheets 12 is provided such that the contact surfaces 30,32 rest against the metallization 28 with a defined force, a contact to the metallization 28 can be produced as soon as the piezoceramic 26 is introduced. It is not necessary in this case for the contact to be established by soldering individual contact points.

As can be seen from FIG. 2, the piezoactuator 10 produced in such a way comprises bent profiled sheets 12 which are mounted externally onto the plastic cage 14. The piezoceramic 26 is placed in an internal cavity of the plastic cage 14. Contact wires 24 can be mounted on the external surfaces of the profiled sheets 12 in order to contact the piezoactuator 10.

The piezoactuator produced in this way can then be enveloped in an insulating film and where necessary completed to form an actuator unit.

Figure 3:
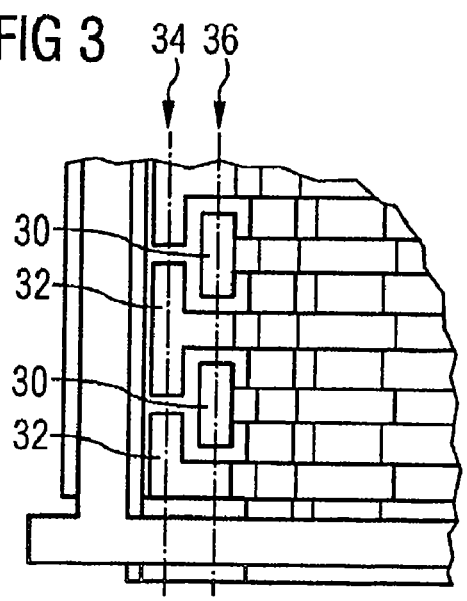
FIG. 3 shows an enlarged section of the contact surfaces resting against the piezoactuator.

As shown in the enlarged diagram of FIG. 3, the contact surfaces 30 and 32 are preferably arranged such that the contact surfaces 30 form a first contact track 36 and the contact surfaces 32 form a second contact track 34. In the direction of extension of the piezoceramic 26 the contact surfaces 30 and 32 have a certain overlap so that a connection to the piezoceramic exists at each point of the metallization 28.

What is claimed is:

1. A Piezoactuator comprising a piezoceramic which can expand when a voltage is applied and contacting elements which rest against the piezoceramic, wherein the contacting elements are formed as profiled sheets each comprising a surface having opposing edges, wherein on one edge of the opposing edges of the profiled sheet there are first and second contact surfaces formed in said surface spaced at intervals from one another, wherein the surfaces of the profiled sheets are bent such that the first and second contact surfaces press with a predetermined force on the piezoceramic to form an electrical contact, wherein the first and second contact surfaces are formed in such a way that the first contact surfaces form a first contact track and the second contact surfaces form a second contact track.

2. Piezoactuator according to claim 1, further comprising a metallization, against which the contact surfaces rest on the piezoceramic, wherein the contact surfaces are fixed relative to contacting surfaces of the metallization in such a way that, when the piezoceramic is axially deflected, no frictional relative movement occurs between the contact surfaces and metallization.

3. A Piezoactuator according to claim 1, wherein the first and second contact surfaces of the first and second contact tracks extend in the longitudinal direction of the piezoceramic.

4. A Piezoactuator according to claim 1, wherein the profiled sheets are fixed to an external surface of a plastic cage and the piezoceramic is positioned in a cavity of the plastic cage.

5. A Piezoactuator according to claim 1, wherein the profiled sheets are fixed to fixing points of a plastic cage.

6. A Piezoactuator according to claim 1, wherein the profiled sheets are caulked to fixing points of a plastic cage.

* * * * *